United States Patent
Lee et al.

(10) Patent No.: US 11,910,160 B2
(45) Date of Patent: Feb. 20, 2024

(54) MEMS ACOUSTIC SENSOR

(71) Applicant: Shinsung SoundMotion Co., Ltd., Gyeonggi-do (KR)

(72) Inventors: Sangwoo Lee, Ann Arbor, MI (US); Kyudong Jung, Gyeonggi-do (KR); Jinho Kim, Gyeonggi-do (KR)

(73) Assignee: SHINSUNG SOUNDMOTION CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/550,716

(22) Filed: Dec. 14, 2021

(65) Prior Publication Data

US 2022/0217473 A1    Jul. 7, 2022

(30) Foreign Application Priority Data

Jan. 7, 2021 (KR) ........................ 10-2021-0001715

(51) Int. Cl.
*H04R 19/04* (2006.01)
*H04R 7/04* (2006.01)
*H04R 7/18* (2006.01)
*B81B 3/00* (2006.01)

(52) U.S. Cl.
CPC ............ *H04R 19/04* (2013.01); *B81B 3/001* (2013.01); *B81B 3/0072* (2013.01); *H04R 7/04* (2013.01); *H04R 7/18* (2013.01); *B81B 2201/0257* (2013.01); *B81B 2203/0127* (2013.01); *B81B 2203/0307* (2013.01); *B81B 2203/0315* (2013.01); *B81B 2203/04* (2013.01); *H04R 2201/003* (2013.01)

(58) Field of Classification Search
CPC .............. H04R 2201/003; H04R 19/04; B81B 2203/0307; B81B 2203/0127
See application file for complete search history.

(56) References Cited

U.S. PATENT DOCUMENTS

2021/0076141 A1*  3/2021  Lee ...................... H04R 19/005

FOREIGN PATENT DOCUMENTS

KR            1312495        10/2013

* cited by examiner

*Primary Examiner* — Sunita Joshi

(57) ABSTRACT

The present invention relates to a MEMS acoustic sensor for sensing variable capacitance between a flexible diaphragm and a back plate. The MEMS acoustic sensor is composed of a substrate comprising a cavity, a back plate supported on the substrate and comprising a plurality of through holes, an electrode formed on the inner surface of the back plate, at least one anchor protruding from the back plate toward the substrate, a diaphragm supported by the at least one anchor and deformed by a sound wave introduced from the outside through the cavity, and a stress release unit extending from the edge portion of the back plate and in contact with the substrate.

9 Claims, 5 Drawing Sheets

[Fig. 1]
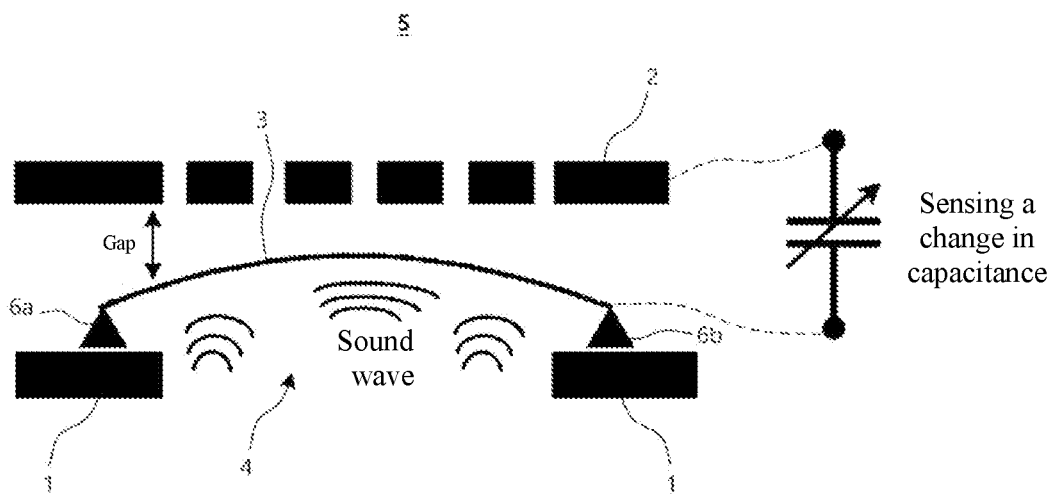
[Fig. 2]
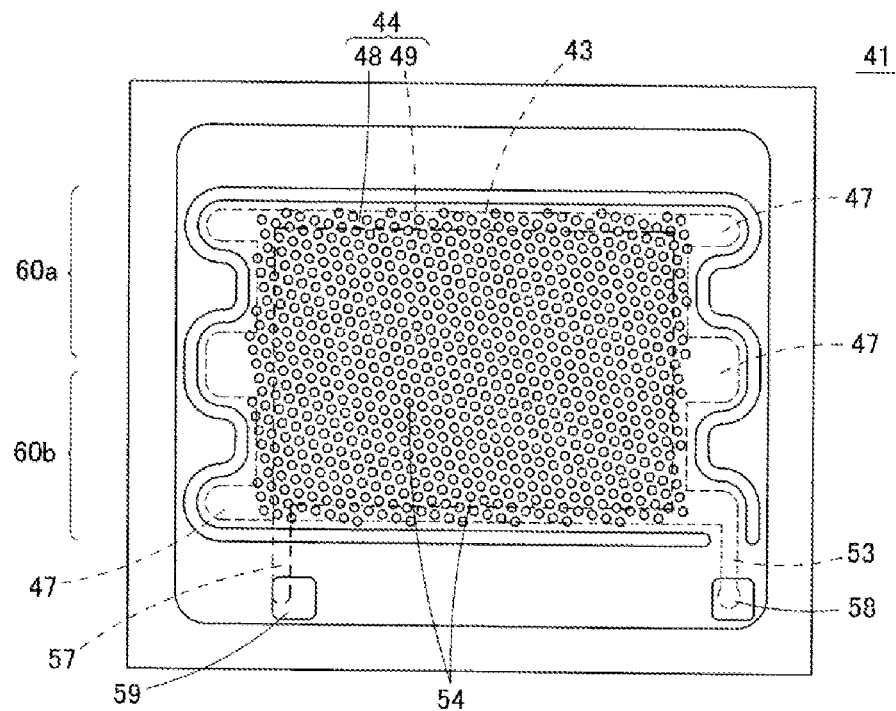

[Fig. 3]
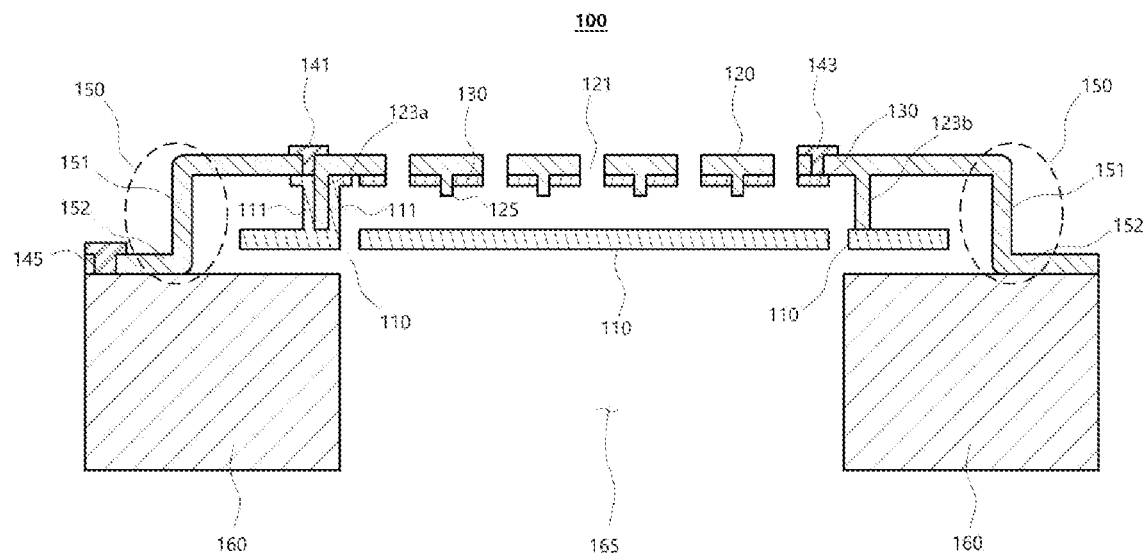
[Fig. 4]
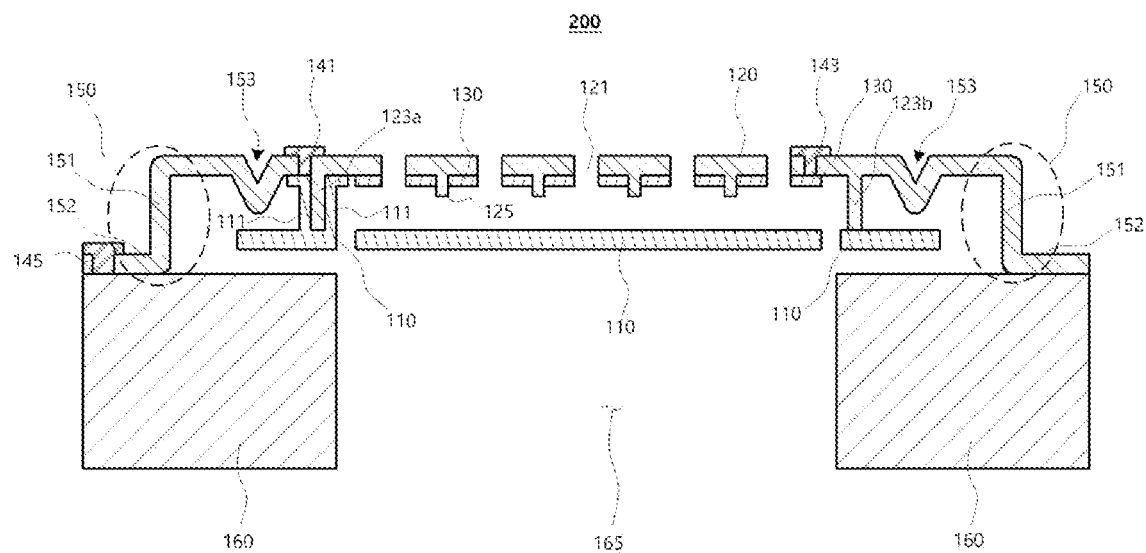

[Fig. 5]
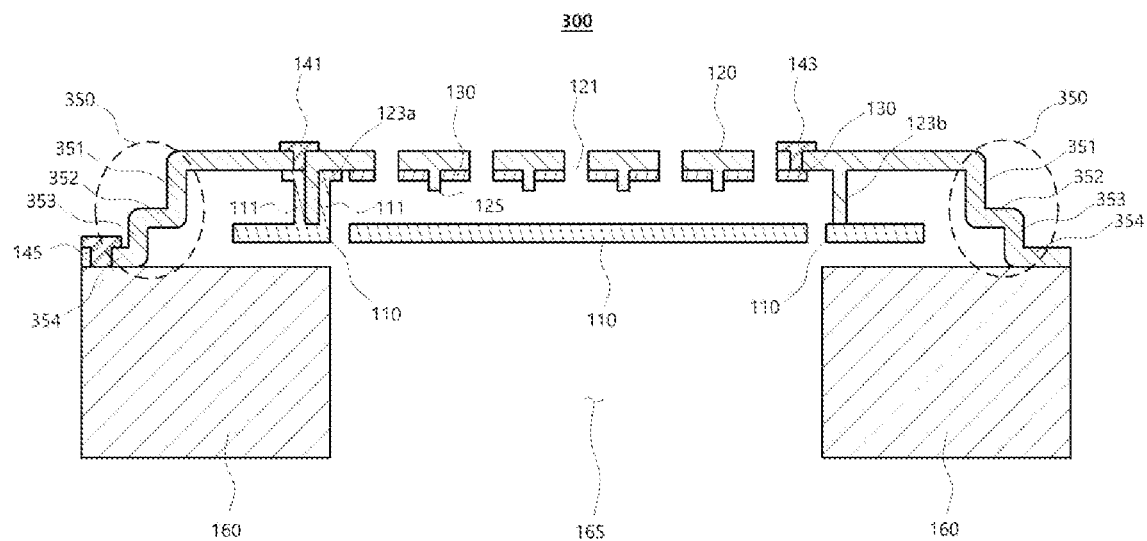
[Fig. 6a]
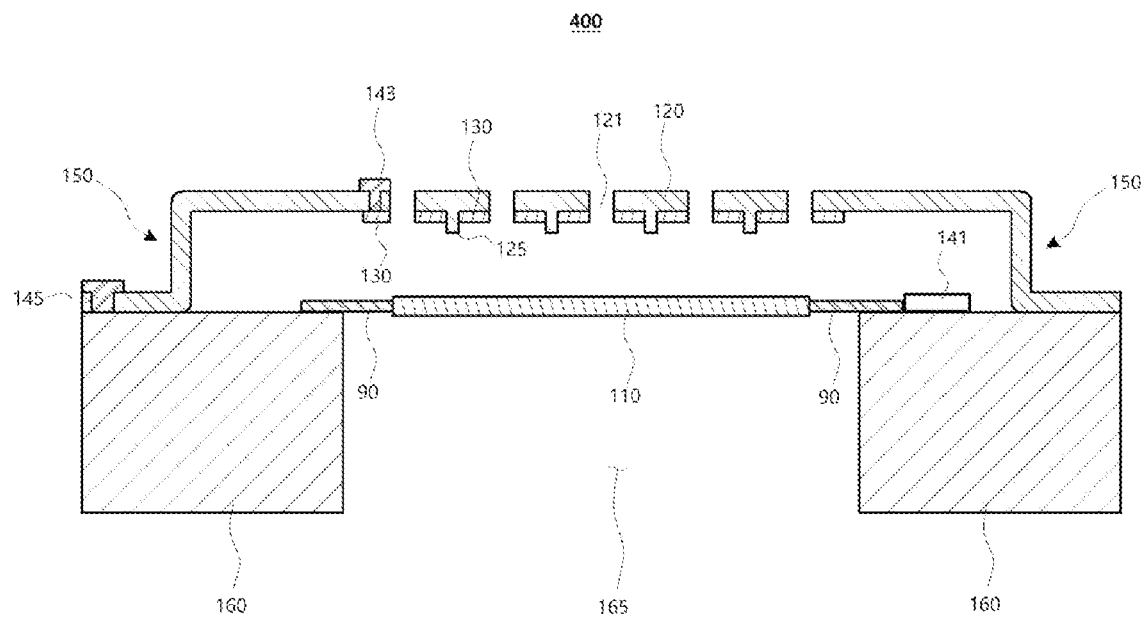

[Fig. 6b]
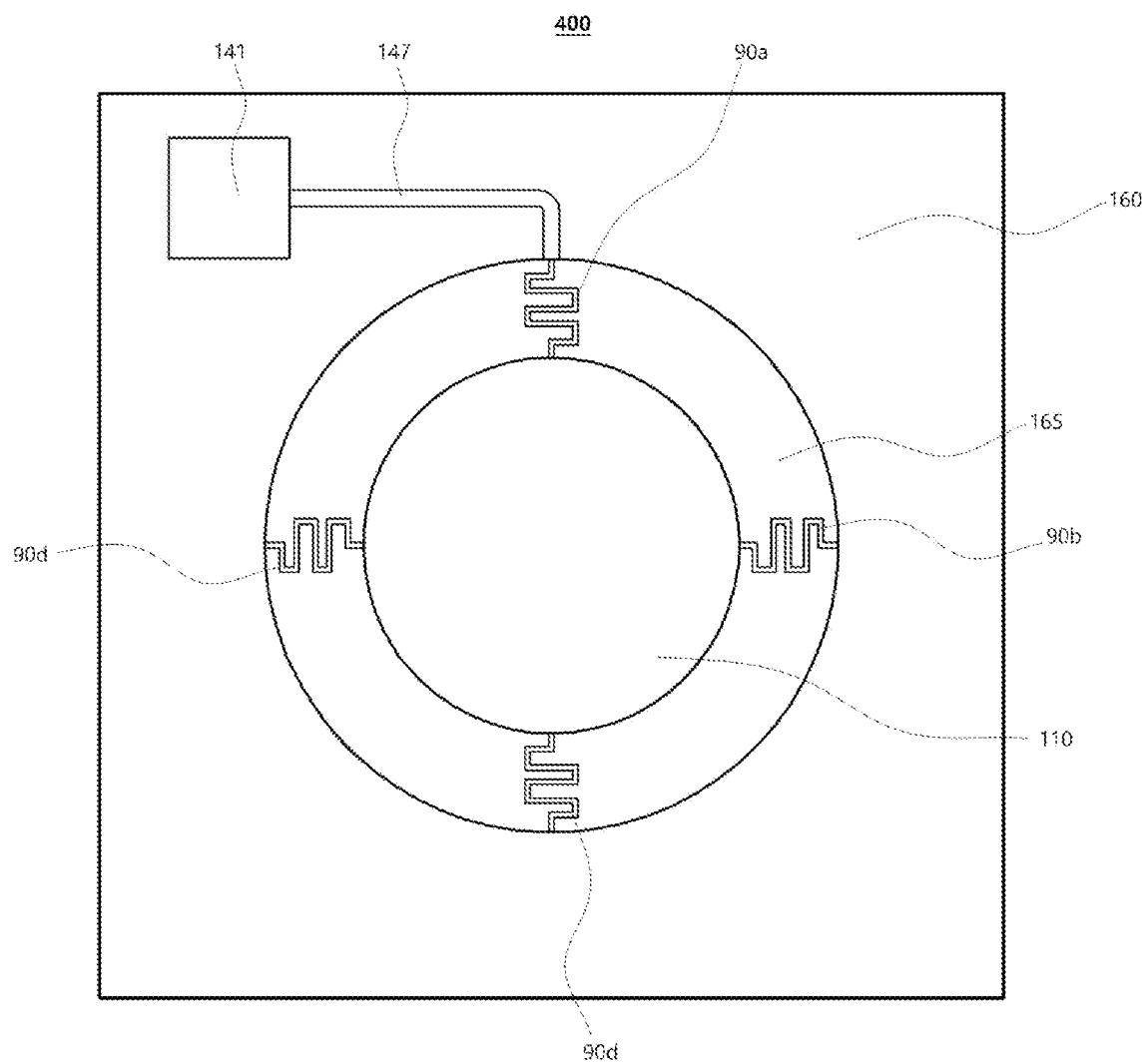

[Fig. 6c]
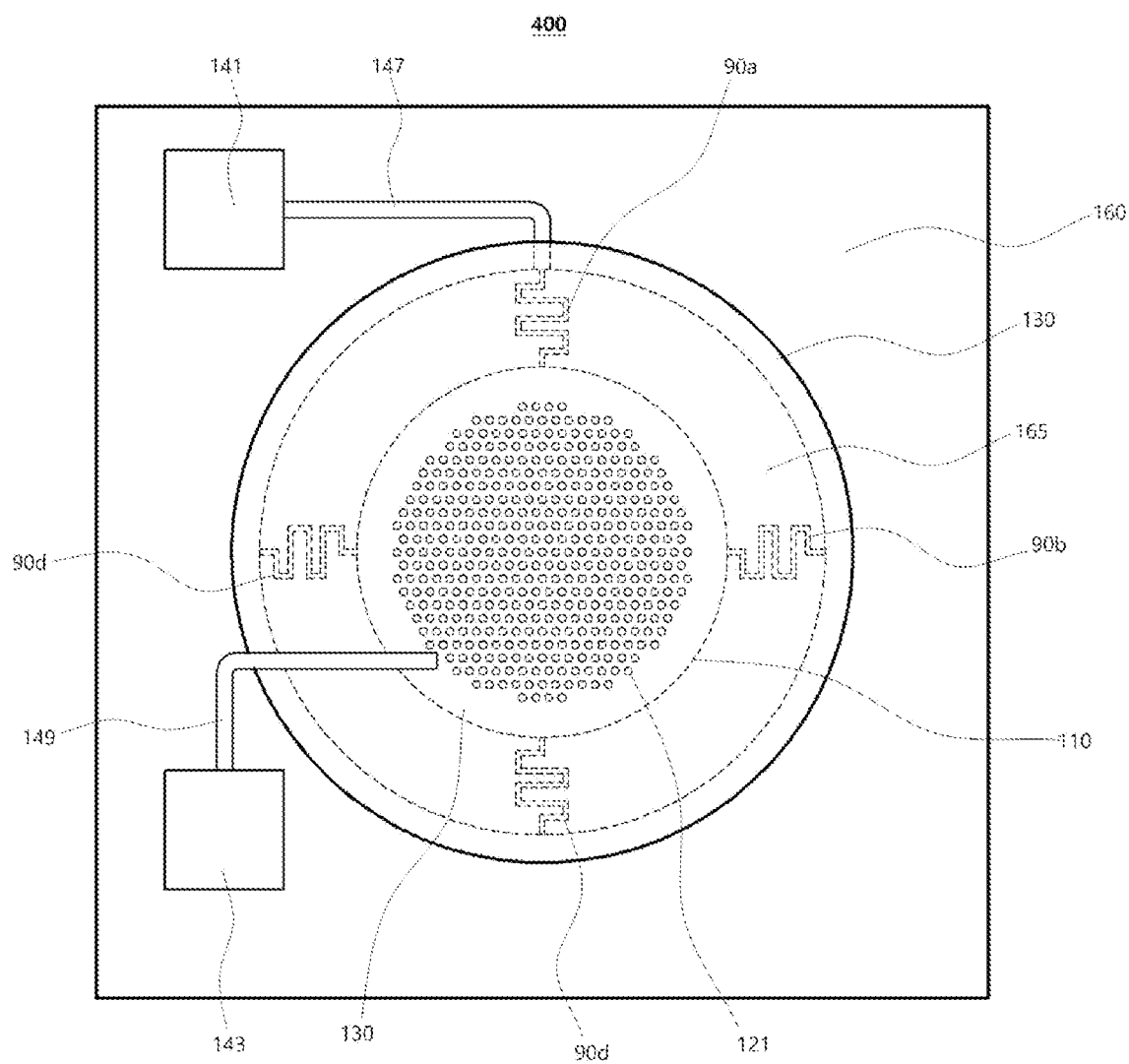

_US 11,910,160 B2_

MEMS ACOUSTIC SENSOR

TECHNICAL FIELD

The present invention relates to an acoustic sensor implemented as a Micro-Electro Mechanical System (MEMS), and more specifically, to a MEMS acoustic sensor for sensing variable capacitance between a flexible diaphragm and a back plate.

BACKGROUND ART

In general, an acoustic sensor, such as a condenser microphone, uses the principle of outputting a change in capacitance or electric capacity generated by vibration of a diaphragm by an external vibration sound pressure as an electrical signal, and is used by attaching to a microphone, telephone, mobile phone, videotape recorder, etc. In particular, recently, such an acoustic sensor is being implemented as a Micro-Electro Mechanical System (MEMS), which further provides an advantage in that it can be mass-produced and miniaturized.

A MEMS acoustic sensor has a diaphragm that moves in response to sound pressure and a fixed opposing element that is acoustically transmissive. The diaphragm functions as a moving electrode of the microphone condenser and the opposing element functions as a fixed electrode of the microphone condenser. In addition, the MEMS acoustic sensor also has means for sensing and measuring a change in the capacity of the microphone capacitor. The diaphragm is implemented as a diaphragm layer above the semiconductor substrate of the device and is installed on an acoustic cavity provided on the back surface of the semiconductor substrate. The opposing element is positioned above or below to be opposed to the diaphragm and is formed in different layers.

Manufacturing such a MEMS acoustic sensor using a semiconductor manufacturing process has significant advantages in terms of production cost, repeatability, and size reduction. The process can be used in a variety of applications, such as communications, audio, ultrasonic range, video, and motion detection systems, with little to no modification.

In general, to achieve wide bandwidth and high sensitivity in a miniaturized MEMS acoustic sensor, it is necessary to form a small and highly sensitive diaphragm structure. Accordingly, the flexibility of the diaphragm can be improved by changing the material, thickness, wrinkle structure, etc. of the diaphragm, but a sufficient input sound pressure must be provided to vibrate the diaphragm of these MEMS acoustic sensors, and there is a limitation for the MEMS acoustic sensor to provide a sufficient Signal-to-Noise ratio (SNR) and high sensitivity at the same time.

In addition, conventional MEMS acoustic sensors may exhibit poor performance in a low frequency band when miniaturizing to a sub-millimeter scale using the semiconductor MEMS process. In particular, the general frequency response characteristic of the MEMS acoustic sensor exhibits high sensitivity in a low frequency band when the area of the diaphragm is wide, and while it can even cover a high frequency band when the area is narrow, there is a problem of poor sensitivity. In consideration of the characteristics of such a MEMS acoustic sensor, recently, studies have been conducted to improve the overall package structure or the shape of the diaphragm itself.

FIG. 1 is a mimetic diagram showing an operation of a conventional MEMS acoustic sensor (5). The MEMS acoustic sensor (5) may be used in various ways, such as a MEMS microphone, a receiver, a speaker, a MEMS pressure sensor, and a MEMS pump. The MEMS acoustic sensor (5) senses a change in coupled capacitance caused by sound pressure between a back plate (2) having perforated through holes and a vibrating membrane of a diaphragm (3). Such a change in capacitance is caused by a change in the air gap between the diaphragm (3) and the back plate (2) operated by way of sound pressure. Both are spaced apart to have a variable air gap, and both ends of the movable diaphragm (3) are supported by suitable support structures (6a, 6b). Such support structures (6a, 6b) are formed on a substrate (1), and the substrate (1) is provided with a cavity (4) for introducing the sound waves. Such support structures may include various methods, such as point support, clamp support, and spring support.

In relation to this, referring to FIG. 2 illustrating the MEMS acoustic sensor of Korean Patent No. 1,312,945, the electrode (49) disposed on the lower surface of the back plate (48) is connected to the fixed-side electrode pad (59) through a lead wire (57) passing through a through hole of the back plate (48). Meanwhile, the lead wire (53) extending from the diaphragm (43) has a structure of being drawn out to the side of the diaphragm (43) so as to be connected to the movable-side electrode pad (58).

In this manner, the lead wire (53) in the conventional MEMS acoustic sensor is drawn out to the side of the diaphragm (43) and connected to the movable-side electrode pad (58), so it is necessary to dispose a lead wire and a movable-side electrode pad inside the MEMS acoustic sensor package. This becomes an element that limits the degree of freedom in designing the MEMS acoustic sensor package and hinders the utilization of space inside the package. In addition, since the lead wire itself has a structure of being extended to the side integrally with the diaphragm, it may also be an element that hinders the free movement of the diaphragm.

In addition, according to the conventional MEMS acoustic sensor, since the sidewall extending laterally from the back plate has a structure of being completely filled, deformation may occur after the back plate (48) is assembled to the substrate and, as a result, the substrate made of a soft material, such as silicon, will be deformed under stress, which may cause a problem of lowered overall precision of the MEMS acoustic sensor.

PRIOR ART DOCUMENTS

Patent Documents

Korean Patent Publication No. 1,312,945 (registered Sep. 24, 2013)

DETAILS OF THE INVENTION

Problem to be Solved

A technical problem to be solved by the present invention considering such problems is improving the degree of freedom in designing the MEMS acoustic sensor package and the utilization of space therein by drawing the electrical connection between the diaphragm and the movable-side electrode pad to the upper side of the back plate by passing through the back plate.

Another technical problem to be solved by the present invention considering such problems is providing a MEMS acoustic sensor capable of resolving (releasing) even if stress occurs in a part after the assembly of the back plate and the substrate.

The technical problems of the present invention are not limited to the technical problems mentioned above, and other technical problems not mentioned herein will be clearly understood by a person with ordinary skill in the art from the following description.

Means to Solve the Problem

The MEMS acoustic sensor according to an embodiment of the present invention for solving said problems is a MEMS acoustic sensor, wherein the MEMS acoustic sensor comprises a substrate comprising a cavity; a back plate supported on the substrate and comprising a plurality of through holes; an electrode formed on the inner surface of the back plate; at least one anchor protruding from the back plate toward the substrate; and a diaphragm supported by the at least one anchor and deformed by a sound wave introduced from the outside through the cavity, wherein the diaphragm comprises an extension extending upward along the at least one anchor from the upper surface of the diaphragm, and the plurality of connection pads comprises a first connection pad in electrical contact with the upper end of the extension and exposed to the outer surface of the back plate by passing through the back plate, and a second connection pad in electrical contact with the electrode and exposed to the outer surface of the back plate by passing through the back plate.

The anchor may be fitted into the extension in the direction of extension of the extension.

The MEMS acoustic sensor further comprises a stress release unit extending from the edge portion of the back plate and in contact with the substrate.

The stress release unit may comprise a support wall bent downward from the back plate; and a flange bent outward from the support wall and in surface-contact with the substrate.

The stress release unit may further comprise a notch facing inward toward the diaphragm between the back plate and the support wall.

The stress release unit may comprise a first support wall bent downward from the back plate; a first flange extending outward from the first support wall and bent parallel to the substrate; a second support wall bent downward from the first flange; and a second flange bent outward from the second support wall and in surface-contact with the substrate.

The MEMS acoustic sensor may further comprise a bump protruding toward the inner surface of the back plate, and the electrode may be penetrated by the bump.

The MEMS acoustic sensor may further comprise an elastic support for connecting the diaphragm and the substrate in a plane direction formed by the diaphragm to elastically support the diaphragm.

A connection pad may be formed on the substrate, and the diaphragm and the connection pad may be electrically connected through the elastic support.

Effect of the Invention

According to the MEMS acoustic sensor according to the present invention, since a stress release structure is formed on the back plate itself, stress can be naturally released without a separate apparatus even after the assembly of the back plate and the substrate.

In addition, according to the MEMS acoustic sensor according to the present invention, since the resonant frequency and rigidity of the diaphragm can be maintained without changes due to the stress release, the precision of the MEMS acoustic sensor can be guaranteed.

BRIEF DESCRIPTION OF THE DRAWINGS

FIG. 1 is a mimetic diagram showing the operation of the conventional MEMS acoustic sensor.

FIG. 2 is a cross-sectional view showing a specific configuration of the conventional MEMS acoustic sensor.

FIG. 3 is a cross-sectional view showing the configuration of the MEMS acoustic sensor according to the first embodiment of the present invention.

FIG. 4 is a cross-sectional view showing the configuration of the MEMS acoustic sensor according to the second embodiment of the present invention.

FIG. 5 is a cross-sectional view showing the configuration of the MEMS acoustic sensor according to the third embodiment of the present invention.

FIG. 6a is a cross-sectional view showing the configuration of the MEMS acoustic sensor according to the fourth embodiment of the present invention.

FIG. 6b is a plane view viewed from above with the back plate removed from the MEMS acoustic sensor according to the fourth embodiment of the present invention.

FIG. 6c is a plane view of the MEMS acoustic sensor according to the fourth embodiment of the present invention viewed from above.

DETAILED DESCRIPTION FOR IMPLEMENTING THE INVENTION

Advantages and characteristics of the present invention and methods for achieving them will become apparent with reference to the embodiments described below in detail together with the accompanying figures. However, the present invention is not limited to the embodiments described below but can be implemented in various different forms, the present embodiments are provided to complete the disclosure of the present invention and to fully inform a person with ordinary skill in the art of the scope of the invention, and the present invention is defined by the scope of claims. The same reference numerals refer to the same components throughout the specification.

Unless otherwise defined, all terms (including technical and scientific terms) used in the present specification may be used with the meaning commonly understood by a person with ordinary skill in the art. In addition, terms defined in a commonly used dictionary are not to be interpreted ideally or excessively unless clearly and specifically defined.

The terms used in the present specification are for the purpose of describing the embodiments and are not intended to limit the present invention. In the present invention, the singular form also includes the plural form, unless otherwise specifically stated in the text. "Comprises" and/or "comprising" used in the specification do not exclude the presence or addition of one or more other components in addition to the stated components.

Hereinafter, an embodiment of the present invention will be described in detail with reference to the accompanying figures. FIG. 3 is a cross-sectional view showing the configuration of the MEMS acoustic sensor (100) according to the first embodiment of the present invention.

The MEMS acoustic sensor (100) may be configured by comprising a substrate (160), a back plate (120), an electrode (130), an anchor (123a, 123b), a diaphragm (110), and a stress release unit (150).

The substrate (160) may be made of a silicon material, and comprises a cavity (165) in the center. Therefore, the sound wave introduced from the outside passes through the cavity (65) and applies an external force to the diaphragm (110), such that the diaphragm (110) having elasticity may vibrate while being deformed by the sound wave. When displacement occurs in the direction perpendicular to the diaphragm (110) (direction perpendicular to the plane formed by the diaphragm) by the sound wave, the capacitance changes due to a change in the gap between the diaphragm (110) and the back plate (120).

The back plate (120) is supported on the substrate (160) and comprises a plurality of through holes (121) communicating upward. At least one anchor (123a, 123b) protruding toward the substrate (160) is formed on the inner surface of the back plate (120). In FIG. 3, the diaphragm (110) is supported by the anchor (123a, 123b) formed on the back plate (120), and no contact is made with the substrate (160). Therefore, the position of the anchor (123a, 123b) may be freely arranged on the back plate (120) regardless of the position and size of the cavity (165).

The electrode (130) may be disposed at a plurality of locations on the inner surface of the back plate (120). Therefore, the capacitance can be measured between the moving diaphragm (110) and the fixed back plate (120).

The diaphragm (110) is supported by the at least one anchor (123a, 123b), and may be deformed by a sound wave introduced from the outside through the cavity (165). The diaphragm (110) may be made of, for example, a polysilicon material having a circular or rectangular shape. However, the shape or material of the diaphragm (110) is not limited thereto and may be changed in any way necessary. In addition, the coupling between the diaphragm (110) and the anchor (123a, 123b) may be achieved by the diaphragm (110) being deposited on the anchor (123a, 123b) directly or through an intermediary material.

In FIG. 3, a plurality of connection pads (141, 143) that are exposed to the outside and electrically connected are provided on the upper surface of the back plate (120), and the plurality of connection pads (141, 143) has a structure of passing through the back plate (120) and extending to the inside of the MEMS acoustic sensor (100) package.

The plurality of connection pads (141, 143) may be configured by comprising a first connection pad (141) (movable-side connection pad) electrically connected to the diaphragm (110), and a second connection pad (143) (fixed-side connection pad) electrically connected to the electrode (130) disposed on the lower surface of the back plate (120). In addition, the plurality of connection pads (141, 143) may further comprise a connection pad (145) in electrical contact with the substrate (160) and exposed to the outside.

Specifically, the electrode (130) disposed on the lower surface of the back plate (120) is in electrical contact with the second contact pad (143) penetrating the back plate (120). Therefore, the electrode (130) may be connected to an external integrated circuit (not shown) by a lead wire (not shown) extending from the second connection pad (143).

In addition, the diaphragm (110) comprises an extension (111) extending upward along the at least one anchor (123a) from the upper surface of the diaphragm (110), and may be formed in a structure in which the anchor (123a) is accommodated in the extension (111), that is, the anchor (123a) can be fitted in the longitudinal direction of the extension (111). Through such a configuration, the extension (111) of the diaphragm (110) and the first connection pad (141) can be in direct contact while the diaphragm (110) can be firmly supported by the anchor (123a). Ultimately, an electrical connection between the diaphragm (110) and the first connection pad (141) can be formed by penetrating through the back plate (120). This provides an advantage that the degree of freedom in designing the package and the efficiency of space therein can be improved compared to that of the conventional MEMS acoustic sensor that draws out the lead wire laterally.

In this manner, the diaphragm (110) may be connected to the external integrated circuit by a lead wire (not shown) extending from the first connection pad (141) exposed to the upper surface of the back plate (120). Ultimately, the integrated circuit can sense the variable capacitance between the diaphragm (110) and the electrode (130) according to the movement of the diaphragm (110) and convert it into an electrical signal (PDM or analog signal).

Meanwhile, the stress release unit (150) is configured to extend from the edge portion of the back plate (120) to be in contact with the substrate (160), and can release stress by its own elasticity even if deformation occurs in the back plate (120) to a certain degree according to its structural characteristics. To this end, the stress release unit (150) may have a thickness equal to or smaller than that of the back plate (120).

The stress release unit (150) according to the first embodiment of the present invention at least comprises a support wall (151) bent downward from the back plate (120) and a flange 152 bent outward from the support wall (151) to be in surface-contact with the substrate (160). As such, by having a certain degree of elasticity due to the mutually bent structure between the back plate (120), the support wall (151), and the flange 152, it becomes possible to release the stress that occurs unavoidably according to the deformation after the assembly of the back plate (120) and the substrate (160). Referring to FIG. 3, it is illustrated that although the diaphragm (110) extends to the outside of the anchor (123a, 123b), the electrode is not formed in the extended portion so as not to interfere with the stress release.

In addition, a bump (125) protruding downward may be provided on the inner surface of the back plate (130), and the electrode (130) may be inserted in the form of being penetrated by this bump (125).

FIG. 4 is a cross-sectional view showing the configuration of the MEMS acoustic sensor according to the second embodiment of the present invention.

In the second embodiment, the stress release unit (150) further comprises a notch (153) facing inward toward the diaphragm (110) between the back plate (120) and the support wall (151) in addition to the support wall (151) and the flange (152). Such a notch (153) facilitates elastic deformation of the stress release unit (150), thereby helping the stress release to occur more easily. Configurations other than the notch (153) are the same as those of the first embodiment, and thus a redundant description will be omitted.

FIG. 5 is a cross-sectional view showing the configuration of the MEMS acoustic sensor according to the third embodiment of the present invention.

According to the third embodiment, the stress release unit (350) comprises a first support wall (351) bent downward from the edge of the back plate (120), a first flange (352) extending outward from the first support wall (351) and bent parallel to the substrate (160), a second support wall (353) bent downward from the first flange (352), and a second flange (354) bent outward from the second support wall (353) and in surface-contact with the substrate (160). Therefore, if the stress release unit (150) according to the first embodiment has a one-time bending structure, the stress release unit (350) according to the third embodiment can be considered as having a two-time bending structure. However, it is not limited thereto, and it is possible to use a bending structure of three times or more for stress release. Configurations other than the stress release unit (350) are the same as those of the first embodiment, and thus a redundant description will be omitted.

FIG. 6a is a cross-sectional view showing the configuration of the MEMS acoustic sensor according to the fourth embodiment of the present invention, FIG. 6b is a plane view viewed from above with the back plate removed from the MEMS acoustic sensor according to the fourth embodiment of the present invention, and FIG. 6c is a plane view of the MEMS acoustic sensor according to the fourth embodiment of the present invention viewed from above.

Unlike the first to third embodiments, the fourth embodiment has a structure in which the diaphragm (110) is supported by a plurality of elastic supports (90: 90a to 90d) rather than a structure in which the diaphragm (110) is supported by an anchor. Therefore, to elastically support the diaphragm (110), an elastic support (90) for connecting both between the diaphragm (110) and the substrate (160) is provided in a plane direction formed by the diaphragm (110). Such an elastic support (90) may be configured as a MEMS spring having a zigzag folding shape but is not limited thereto.

Connection pads (141, 143) are formed on the substrate (160), which allows each connection pad (141, 143) to be connected to the diaphragm (110) and the back plate (130) through lead wires (147, 149). In particular, in addition to the role of providing elastic support when the diaphragm (110) vibrates, the elastic support (90) also plays the role of electrically connecting the diaphragm (110) and the lead wire (147). Therefore, since an electrical connection can be achieved from the diaphragm (110) to the connection pad (141) without a separate electrical connection structure, the capacitance between the diaphragm (110) and the back plate (130) can be calculated.

The embodiments of the present invention have been described above with reference to the accompanying figures, but a person with ordinary skill in the art will understand that the present invention may be implemented in other specific forms without changing the technical idea or essential features thereof. Therefore, it should be understood that the embodiments described above are illustrative in all respects and not restrictive.

DESCRIPTION OF REFERENCE NUMERALS 90, 90a, 90b, 90c, 90d: Elastic supports
100, 200, 300, 400: MEMS acoustic sensors
110: Diaphragm
111: Extension
120: Back plate
121: Through hole
123a, 123b: Anchors
125: Bump
130: Electrode
141, 143, 145: Contact pads
147, 149: Lead wires
150: Stress release unit
151, 351, 353: Support walls
152, 352, 354: Flanges
153: Notch
160: Substrate
165: Cavity

The invention claimed is:

1. A MEMS acoustic sensor comprising:
a substrate having a cavity;
a back plate supported on the substrate and comprising a plurality of through holes;
an electrode formed on an inner surface of the back plate;
at least one anchor protruding from the back plate toward the substrate;
a diaphragm supported by the at least one anchor, the diaphragm being deformable by a sound wave introduced through the cavity; and
a plurality of connection pads exposed to an upper surface of the back plate,
wherein the diaphragm comprises an extension extending upward along the at least one anchor from an upper surface of the diaphragm, and the plurality of connection pads comprise a first connection pad in electrical contact with an upper end of the extension and exposed to an outer surface of the back plate by passing through the back plate, and a second connection pad in electrical contact with the electrode and exposed to the outer surface of the back plate by passing through the back plate.

2. The MEMS acoustic sensor of claim 1, wherein the at least one anchor is fitted into the extension.

3. The MEMS acoustic sensor of claim 1, further comprising a stress release unit extending from an edge portion of the back plate and in contact with the substrate.

4. The MEMS acoustic sensor of claim 3, wherein the stress release unit comprises a support wall bent downward from the back plate and a flange bent outward from the support wall and in surface-contact with the substrate.

5. The MEMS acoustic sensor of claim 4, wherein the stress release unit further comprises a notch facing inward toward the diaphragm between the back plate and the support wall.

6. The MEMS acoustic sensor of claim 3, wherein the stress release unit comprises:
a first support wall bent downward from the back plate;
a first flange extending outward from the first support wall and bent parallel to the substrate;
a second support wall bent downward from the first flange; and
a second flange bent outward from the second support wall and in surface-contact with the substrate.

7. The MEMS acoustic sensor of claim 1, further comprising a bump extending downward from the inner surface of the back plate, wherein the electrode is penetrated by the bump.

8. The MEMS acoustic sensor of claim 1, further comprising an elastic support connecting the diaphragm and the substrate in a plane direction formed by the diaphragm to elastically support the diaphragm.

9. The MEMS acoustic sensor of claim 8, wherein one of the plurality of connection pads is formed on the substrate, and
the diaphragm and the one of the plurality of connection pads are electrically connected through the elastic support.

* * * * *